United States Patent
Matthias

(10) Patent No.: US 8,525,302 B2
(45) Date of Patent: Sep. 3, 2013

(54) BIPOLAR PUNCH-THROUGH SEMICONDUCTOR DEVICE AND METHOD FOR MANUFACTURING SUCH A SEMICONDUCTOR DEVICE

(75) Inventor: Sven Matthias, Lenzburg (CH)

(73) Assignee: ABB Technology AG, Zurich (CH)

( * ) Notice: Subject to any disclaimer, the term of this patent is extended or adjusted under 35 U.S.C. 154(b) by 0 days.

(21) Appl. No.: 13/523,184

(22) Filed: Jun. 14, 2012

(65) Prior Publication Data

US 2012/0319227 A1 Dec. 20, 2012

(30) Foreign Application Priority Data

Jun. 14, 2011 (EP) ..................... 11169792

(51) Int. Cl.
*H01L 21/02* (2006.01)
(52) U.S. Cl.
USPC ............... 257/611; 257/656; 257/E21.352; 257/E29.332; 438/527
(58) Field of Classification Search
USPC ............... 257/611, 656, E21.352, E29.332; 438/527
See application file for complete search history.

(56) References Cited

U.S. PATENT DOCUMENTS

| 2008/0173968 A1 | 7/2008 | Schulze et al. |
| 2010/0136774 A1 | 6/2010 | Schulze et al. |
| 2011/0108941 A1* | 5/2011 | Vobecky et al. ............ 257/477 |
| 2011/0278694 A1* | 11/2011 | Rahimo et al. ............ 257/497 |
| 2012/0267681 A1* | 10/2012 | Nemoto et al. ............ 257/139 |

FOREIGN PATENT DOCUMENTS

DE 10 2007 001108 A1 7/2008

OTHER PUBLICATIONS

European Search Report issued on Nov. 7, 2011, by the European Patent Office.
J. Vobecky et al., "The Radiation Enhanced Diffusion (RED) Diode Realization of a Large Area $p^+p^-n^-n^+$ Structure With High SOA", 2009 $21^{st}$ International Symposium on Power Semiconductor Devices & IC's (ISPSD), Jun. 14, 2009, pp. 144-147, XP-03148159.
J. Vobecky et al., "Helium Irradiated High-Poer P-i-N Diode With Low On-State Voltage Drop", Solid-State Electronics, vol. 47, No. 1, Jan. 1, 2003, pp. 45-50, XP-004392865.

* cited by examiner

*Primary Examiner* — Trung Q Dang
(74) *Attorney, Agent, or Firm* — Buchanan Ingersoll & Rooney PC

(57) ABSTRACT

A bipolar diode is provided having a drift layer of a first conductivity type on a cathode side and an anode layer of a second conductivity type on an anode side. The anode layer includes a diffused anode contact layer and a double diffused anode buffer layer. The anode contact layer is arranged up to a depth of at most 5 μm, and the anode buffer layer is arranged up to a depth of 18 to 25 μm. The anode buffer layer has a doping concentration between $8.0*10^{15}$ and $2.0*10^{16}$ cm$^{-3}$ in a depth of 5 μm and between $1.0*10^{14}$ up to $5.0*10^{14}$ cm$^{-3}$ in a depth of 15 μm (Split C and D), resulting in good softness of the device and low leakage current. Split A and B show anode layer doping concentrations of known diodes, which have either over all depths lower doping concentrations resulting in high leakage current or enhanced doping concentration resulting in bad softness.

22 Claims, 7 Drawing Sheets

BIPOLAR PUNCH-THROUGH SEMICONDUCTOR DEVICE AND METHOD FOR MANUFACTURING SUCH A SEMICONDUCTOR DEVICE

RELATED APPLICATIONS

This application claims priority under 35 U.S.C. §119 to European Patent Application No. 11169792.6 filed in Europe on Jun. 14, 2011, the entire content of which is hereby incorporated by reference in its entirety.

FIELD

The present disclosure relates to the field of power electronics. More particularly, the present disclosure relates to a method for manufacturing a bipolar diode, and to such a bipolar diode.

BACKGROUND INFORMATION

A known diode includes on a cathode side an (n−) doped drift layer, and on an anode side opposite to the cathode side a p doped anode layer. On top of the p doped anode layer, a metal layer which functions as an anode electrode is arranged. On the cathode side, a higher (n+) doped cathode layer is arranged. A metal layer in the form of a cathode electrode is arranged on top of the (n+) doped cathode layer.

Such devices are created by making one ion diffusion for the anode contact layer and another ion diffusion for the anode buffer layer. By this method, first ions for the anode buffer layer are implanted and deeply diffused into a wafer into a depth of around 20 μm, and afterwards, second ions are implanted and diffused into a depth of around 5 μm.

FIG. 11 shows the doping profiles of known p doped anode layers (split A and B), which include a highly doped and shallow anode contact layer and a deeper diffused, but lower doped anode buffer layer. The maximum doping concentration of the anode contact layer is around $5*10^{18}$ cm$^{-3}$.

The anode buffer layer can be optimized either for leakage current, for which a high doping concentration is needed in a low depth of 5 μm, e.g., a doping concentration higher than $1*10^{16}$ cm$^{-3}$ in 5 μm depth is used for such devices (Split A). Such a high doping concentration in 5 μm has the consequence that the doping concentration in a larger depth of 15 μm is also as high as $7.2*10^{14}$ cm$^{-3}$. This is the consequence from using a single diffusion for the anode buffer layer. However, the high doping concentration in 15 μm has disadvantages for the soft turn off of the device.

Therefore, other devices are made, which are optimized for soft turn off of the device, which requires a deep, but low doped anode buffer layer, which is achieved by having a low doping concentration of $1.5*10^{14}$ cm$^{-3}$ in 15 μm depth (Split B). However, this can only be achieved by also lowering the doping concentration in 5 μm to $4*10^{15}$ cm$^{-3}$, which value is again unfavourable for the leakage current.

With such known devices, it is not possible to influence the curvature of the doping concentration profile, and thus, it is not possible to optimize leakage current and softness simultaneously in one device.

SUMMARY

An exemplary embodiment of the present disclosure provides a method of manufacturing a bipolar diode having a drift layer of a first conductivity type on a cathode side and an anode layer of a second conductivity type on an anode side opposite to the cathode side. The anode layer includes an anode contact layer and an anode buffer layer. The second conductivity type is different from the first conductivity type. The exemplary method includes the following manufacturing steps in the following order: (a) providing a low-doped wafer of the first conductivity type, where the wafer has a first side and a second side opposite to the first side, and part of the wafer of unamended doping concentration in the finalized diode forms the drift layer; (b) applying first ions to the wafer on the second side; (c) diffusing the first ions into the wafer up to a first depth; (d) applying second ions to the wafer on the second side; (e) creating the anode buffer layer by diffusing the first and second ions into the wafer such that a total doping concentration is achieved between $8.0*10^{16}$ and $2.0*10^{16}$ cm$^{-3}$ in a second depth of 5 μm and between $1.0*10^{14}$ up to $5.0*10^{14}$ cm-3 in a third depth of 15 μm; (f) applying third ions to the wafer on the second side; and (g) creating the anode contact layer by diffusing the third ions into the wafer up to a fourth depth of at most 5 μm. All depths are measured from the second side.

An exemplary embodiment of the present disclosure provides a bipolar diode having a drift layer of a first conductivity type on a cathode side and an anode layer of a second conductivity type on an anode side. The second conductivity type is different from the first conductivity type, and the cathode side is opposite to the anode side. The anode layer includes a diffused anode contact layer and a diffused anode buffer layer. The anode contact layer is arranged up to a depth of at most 5 μm. The anode buffer layer has a doping concentration between $8.0*10^{15}$ and $2.0*10^{16}$ cm$^{-3}$ in a depth of 5 μm and between $1.0*10^{14}$ up to $5.0*10^{14}$ cm$^{-3}$ in a depth of 15 μm. All depths are measured from the anode side.

BRIEF DESCRIPTION OF DRAWINGS

Additional refinements, advantages and features of the present disclosure are described in more detail below with reference to exemplary embodiments illustrated in the drawings, in which.

DETAILED DESCRIPTION

Figure 1:
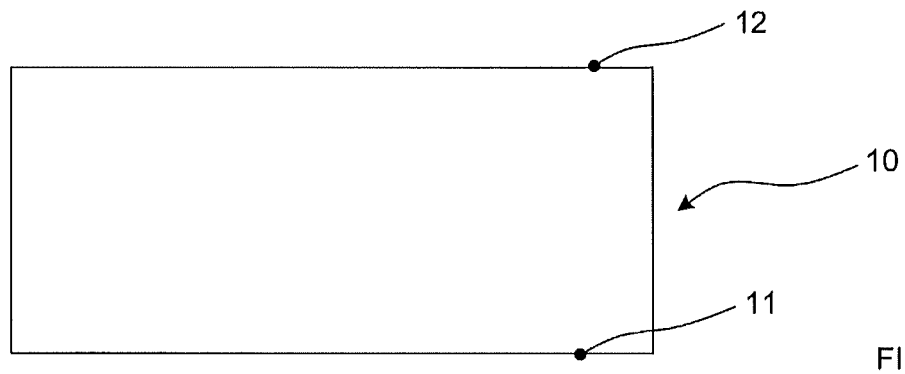
FIGS. 1 to 7 show manufacturing steps for manufacturing a semiconductor device according to an exemplary embodiment of the present disclosure.
Figure 2:
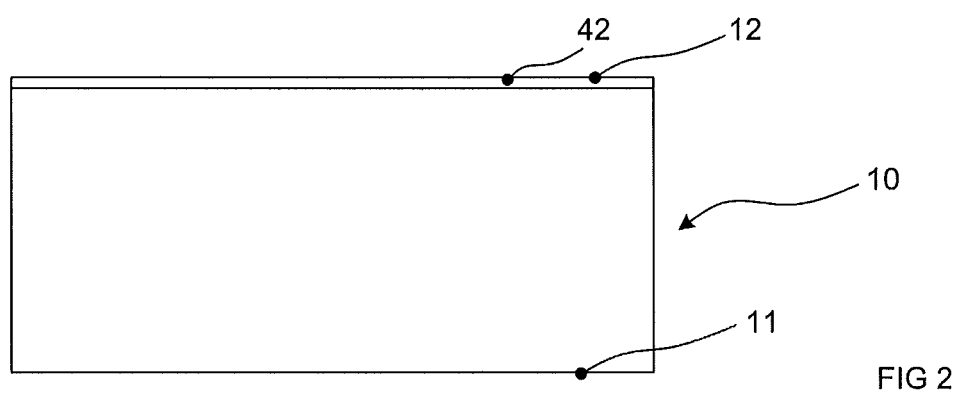
Figure 3:
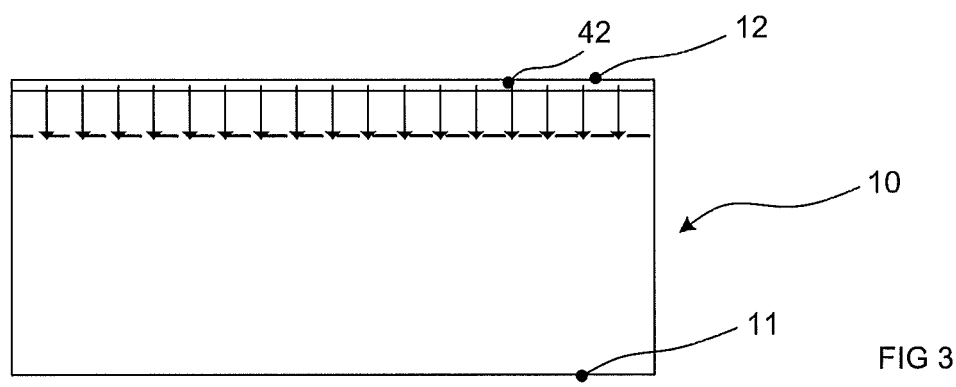
Figure 4:
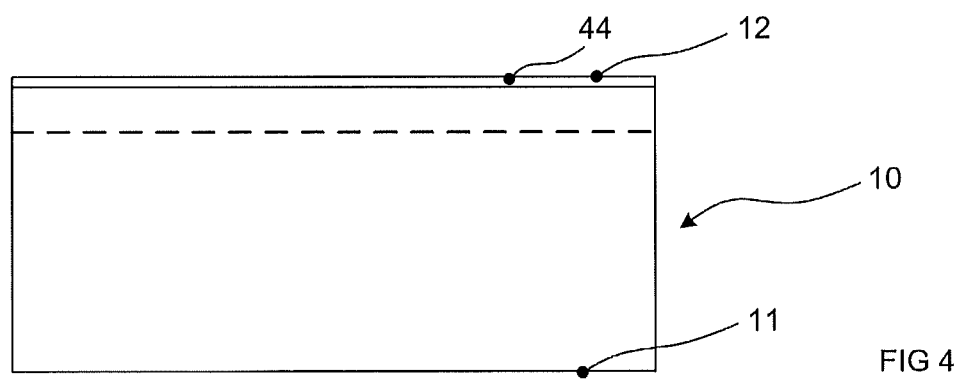
Figure 5:
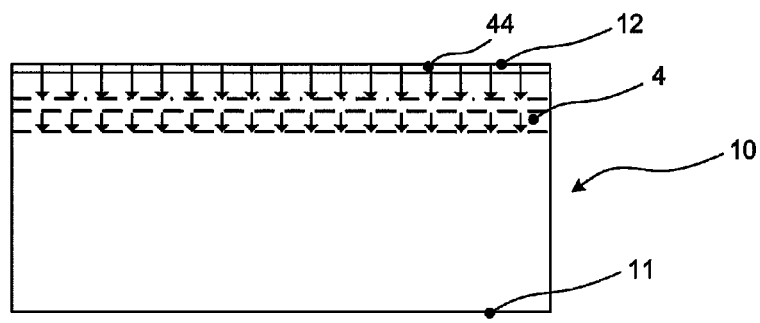
Figure 6:
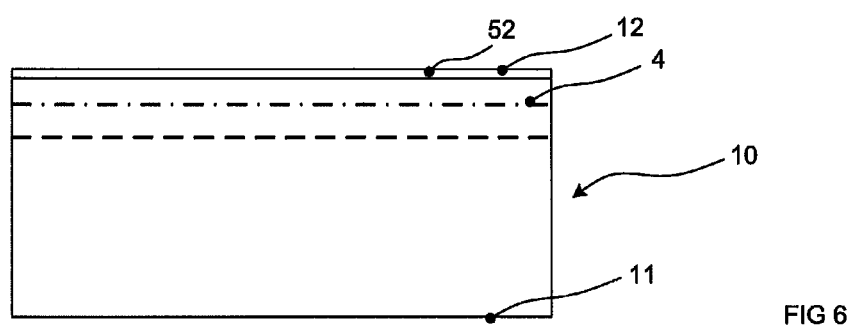
Figure 7:
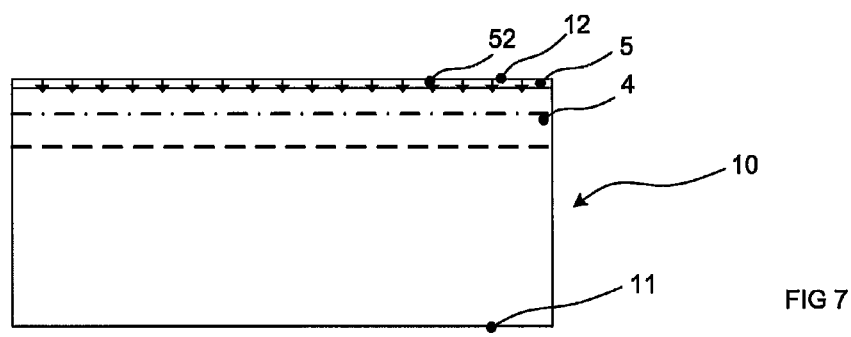
Figure 8:
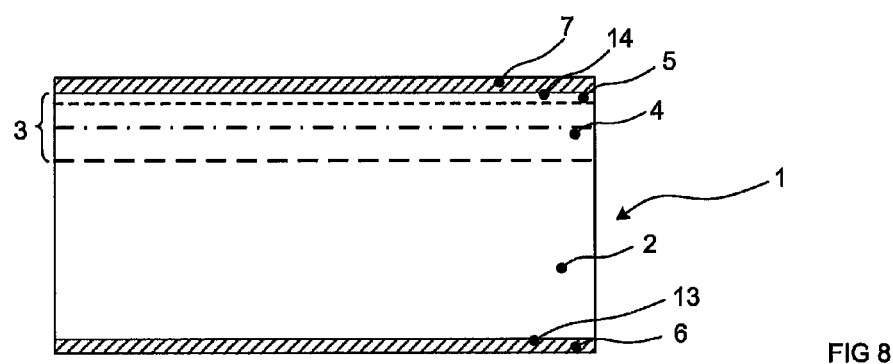
FIG. 8 shows a cross sectional view of a diode according to an exemplary embodiment of the present disclosure.
Figure 9:
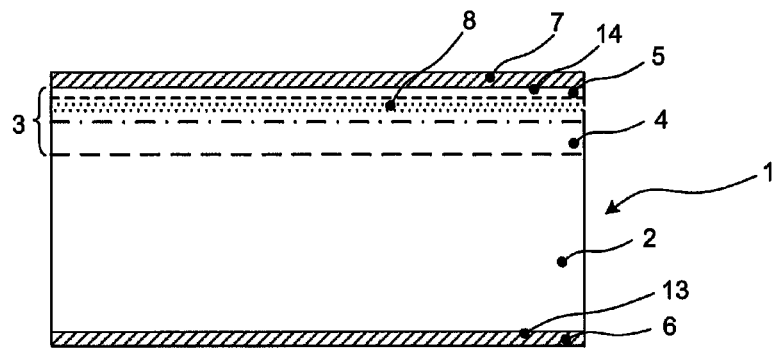
FIG. 9 shows a cross sectional view of a diode having a defect layer, according to an exemplary embodiment of the present disclosure.
Figure 10:
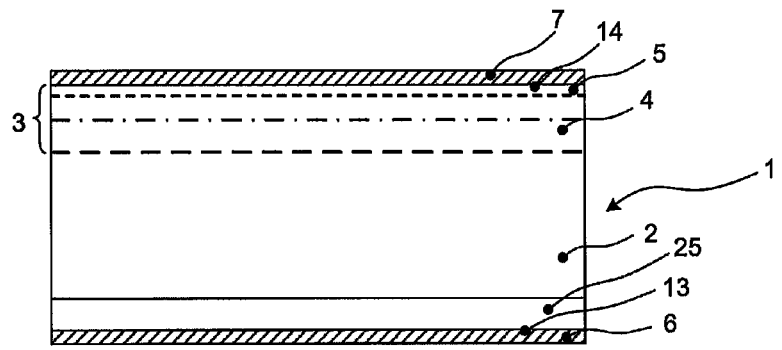
FIG. 10 shows a cross sectional view of a diode having a cathode layer, according to an exemplary embodiment of the present disclosure.

The reference symbols used in the drawings and their meaning are summarized in the list of reference symbols. Generally, alike or alike-functioning parts are given the same reference symbols. The described embodiments are meant as examples and shall not confine the disclosure.

Exemplary embodiments of the disclosure provide a method for manufacturing a bipolar diode having better softness and less leakage current, than is achievable by known methods.

Exemplary embodiments of the present disclosure also provide such a bipolar diode produced according to the exemplary method.

An exemplary embodiment of the present disclosure provides a method for manufacturing a bipolar diode having a drift layer of a first conductivity type on a cathode side and an anode layer of a second conductivity type on an anode side opposite to the cathode side. The second conductivity type is different from the first conductivity type. The anode layer includes an anode contact layer and an anode buffer layer. The method includes the following manufacturing steps in the following order: (a) providing a low-doped wafer of the first conductivity type, where the wafer has a first side and a second side opposite to the first side, and part of the wafer of unamended doping concentration in the finalized diode forms the drift layer; (b) applying first ions to the wafer on the second side; (c) diffusing the first ions into the wafer up to a first depth; (d) applying second ions to the wafer on the second side; (e) creating the anode buffer layer by diffusing the first and second ions into the wafer such that a total doping concentration is achieved between $8.0*10^{15}$ and $2.0*10^{16}$ cm$^{-3}$ in a second depth of 5 μm and between $1.0*10^{14}$ up to $5.0*10^{14}$ cm-3 in a third depth of 15 μm; (f) applying third ions to the wafer on the second side; and (g) creating an anode contact layer by diffusing the third ions into the wafer up to a fourth depth of at most 5 μm, All depths are measured from the second side.

By applying a triple anode layer made of an anode contact layer and at least a double diffused anode buffer layer, the doping concentration profile can be enhanced in a shallow depth of 5 μm and still can be made deep and lowly diffused in 15 μm. Thus, the devices provide in terms of device performance lower leakage currents and softer turn-off behavior.

Figure 11:
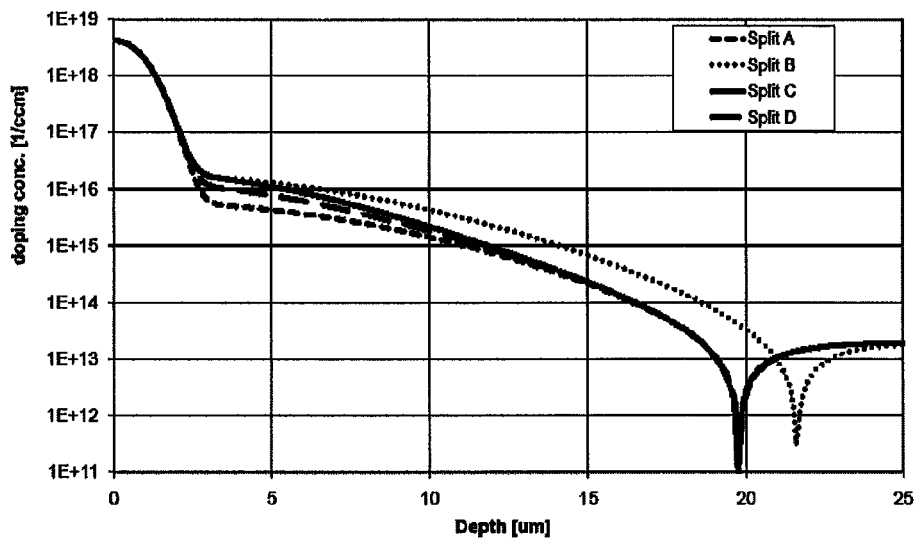
FIG. 11 shows doping concentration profiles of diodes according to the present disclosure and known diodes.
Figure 12:
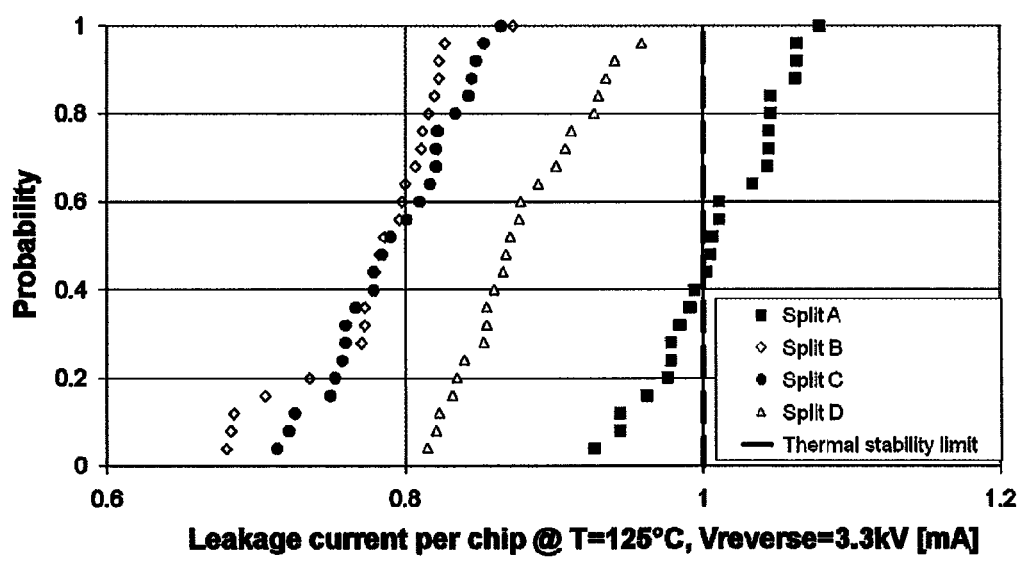
FIG. 12 shows probability curves of having a diode type with a given leakage current.

The doping concentration profiles shown in FIG. 11 have been achieved with the following doses:

and the Split C according to the present disclosure show about the same low leakage current, whereas Split D has a slightly higher leakage current, but still close to those of Split B and C. This result is also confirmed by FIG. 12, in which the probability of having a diode with a given leakage current is shown. Split A is in the graphics far on the right side, i.e. on the side of high leakage current, whereas Split B, C and D have much lower leakage current.

Figure 15:
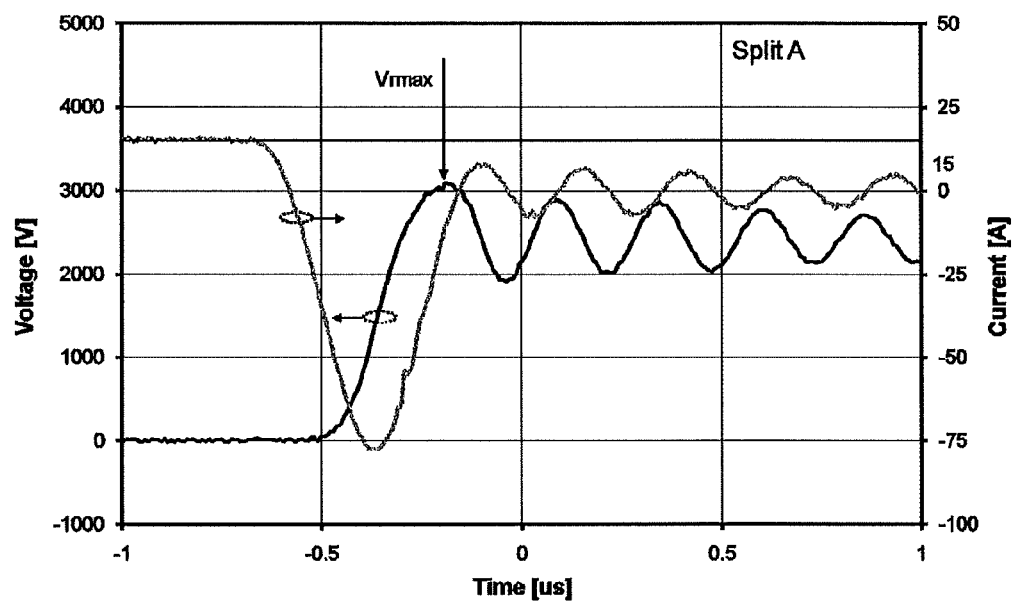
FIG. 15-18 show leakage current and reverse recovery voltage versus time for diodes according to the present disclosure and known diodes.

FIGS. 15 to 18 show leakage current measurements and reverse recovery voltage during turn-off for the diodes: Split A, B, C and D. In the drawings, the darker line (marked by circle with arrow to the left side) shows the voltage, whereas the lighter line shows the current (marked by circle with arrow to the right side). FIG. 15 shows that Split A (low doping concentration at small and high depth) shows a soft turn-off behaviour (3101 V at maximum), but a high leakage current (see also FIG. 12).

Figure 16:
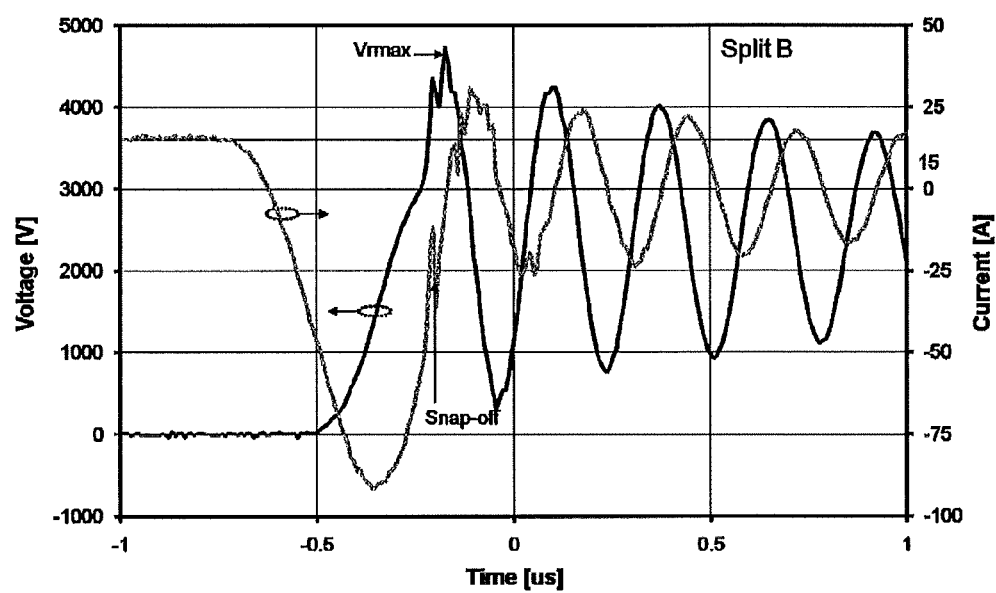
Figure 17:
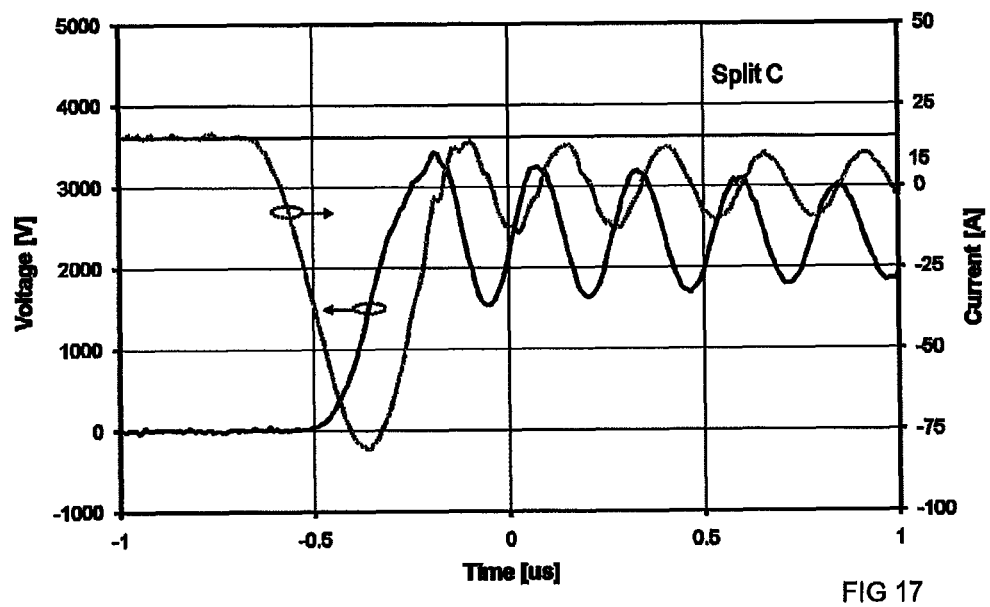
Figure 18:
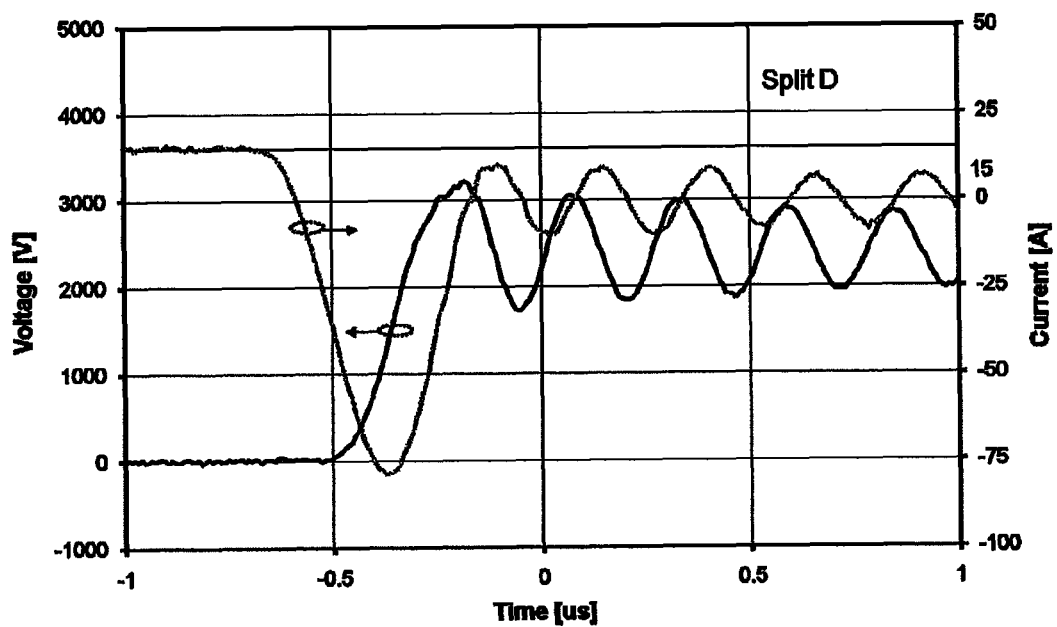

On the other hand, FIG. 16 shows a device with high doping concentration in low and large depth, but the device is snappy and has a high reverse recovery voltage. FIGS. 17 and 18 show the diodes Split C and D according to the present disclosure, both of which show good properties concerning softness and leakage current so that one of these properties does not scarify the other property.

The diodes of the present disclosure are particularly advantageous for diodes with breakdown voltage above 2.5 kV, for example.

The diode of the present disclosure can be used, for example, as a free-wheeling or clamping diode in IGCT (Integrated gate commutated thyristor) or a free-wheeling diode in the IGBT (insulated gate bipolar transistor) applications.

Additional exemplary embodiments of the present disclosure are described in more detail below.

In FIGS. 1 to 8, a method for manufacturing a bipolar diode 1 is shown, according to an exemplary embodiment of the present disclosure. The diode 1 has an (n−) doped drift layer 2 on a cathode side 13 and a p doped anode layer 3 on an anode side 14 opposite to the cathode side 13. The anode layer 3 comprises an anode contact layer 5 and an anode buffer layer 4.

The exemplary method of the present disclosure includes the following manufacturing steps in the following order:
(a) providing a low-(n−) doped wafer 10, which wafer 10 has

|  | Split A | Split B | Split C | Split D |
|---|---|---|---|---|
| first ion dose | $5 * 10^{12}$ cm$^{-2}$ | $15 * 10^{12}$ cm$^{-2}$ | $5 * 10^{12}$ cm$^{-2}$ | $5 * 10^{12}$ cm$^{-2}$ |
| second ion dose | — | — | $1 * 10^{13}$ cm$^{-2}$ | $5 * 10^{12}$ cm$^{-2}$ |
| third ion dose | $5 * 10^{14}$ cm$^{-2}$ | $5 * 10^{14}$ cm$^{-2}$ | $5 * 10^{14}$ cm$^{-2}$ | $5 * 10^{14}$ cm$^{-2}$ |
| $V_{rmax}$ during reverse recovery (diode turn-off) | 3101 V | 4720 V | 3434 V | 3225 V |
| $I_{reverse}$ Mean Leakage current | 1 mA | 0.78 A | 0.79 A | 0.88 A |

Figure 13:
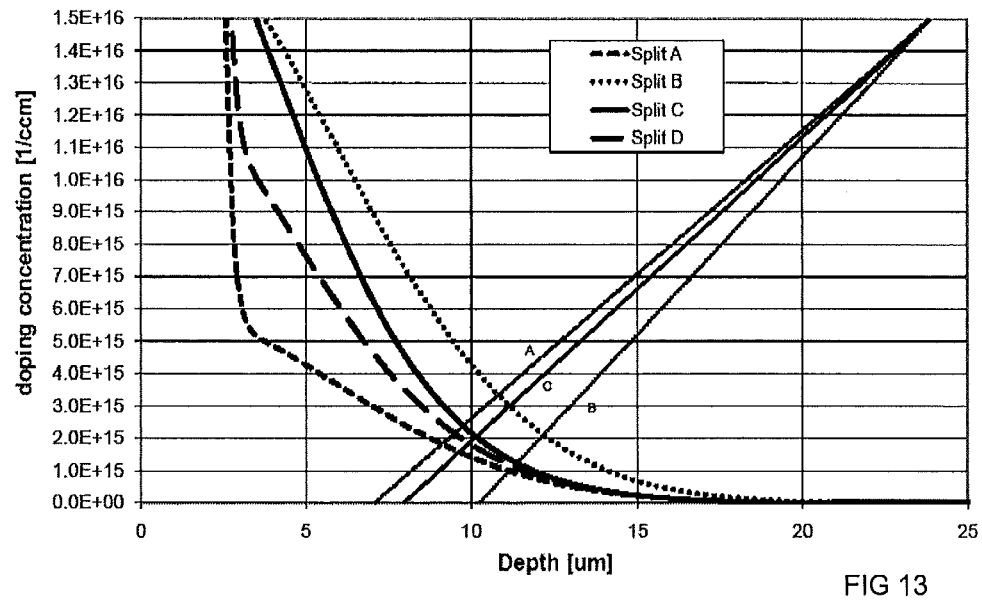
FIG. 13 shows the doping profiles of the diodes according to FIG. 11 in more detail.

FIG. 13 shows the doping concentration profiles of FIG. 11 in more detail for the smaller depths. Also schematically shown is the electric field during blocking. If the electric field comes too close to the second side, it penetrates into the zone of irradiation defects (depth of 5 to 7 μm) generating higher leakage current. Therefore, Split A, for which the space charge region extends to a small depth (from the second side) has the largest leakage current of the devices. Known Split B a first side 11 (cathode side 13) and a second side 12 (anode side 14) opposite to the first side 11 (FIG. 1), wherein such part of the wafer of unamended doping concentration in the finalized diode forms the drift layer 2,
(b) applying first ions 42 to the wafer 10 on the second side 12 (FIG. 2) for the creation of the p doped anode buffer layer 4,
(c) diffusing the first ions 42 into the wafer 10 up to a first depth (FIG. 3), exemplarily to at least 13 μm, (d) applying second ions 44 to the wafer 10 on the second side 12 (FIG. 4) for the creation of the p doped anode buffer layer 4, (e) creating the anode buffer layer 4 by diffusing the first and second ions 42, 44 into the wafer 10 such that a total doping concentration is achieved between $8.0*10^{15}$ and $2.0*10^{16}$ cm$^{-3}$ in a second depth of 5 µm and between $1.0*10^{14}$ up to $5.0*10^{14}$ cm$^{-3}$ in a third depth of 15 µm (FIG. 5), (f) applying third ions 52 to the wafer 10 on the second side 12 (FIG. 6) for the creation of the anode contact layer 5, and (g) creating an anode contact layer 5 by diffusing the third ions 52 into the wafer 10 up to a fourth depth of at most 5 µm (FIG. 7), All depths are measured from the second side 12, i.e. from the anode sided surface of the anode contact layer 5.

In steps (b) and (d), the first and second ions 42, 44 may be chosen to be of the same particle sort. Also, the third ions may be of the same particle sort, but also other ions may be used. For example, B, Al or Ga ions may be used as first, second and/or third ions 42, 44, 52.

The first and second ions 42, 44 for the creation of the anode buffer layer 4 (or third ions 52 for the creation of the anode contact layer 5) can be applied by surface deposition or by ion implantation. Depending of the method for applying the ions onto the wafer surface, the ions 42, 44, 52 are deposited only at one side, for example, the second side 12 (like in the ion implantation method) or on both sides of the wafer (first and second side 11, 12 like in a surface deposition method). In case of double sided applying, the ions on the first side 11 are removed before diffusion, for example, by etching or polishing, and then the ions are driven-in only at the second side 12 or the ions are diffused on both sides and the wafer is thinned on the first side 11 after diffusion as to completely remove the p doped layer created on the first side 11.

The first and second ions 42, 44 may be applied in step (b) and (d) with a first and second implant/deposition dose, in the following called implant dose, each of which exemplarily being between $1*10^{12}$ cm$^{-2}$ and $1*10^{13}$ cm-2, wherein the sum of the first and second implant dose is exemplarily between $3*10^{12}$ cm-2 and $15*10^{12}$ cm-2.

The implant dose of the first ions may be the same as the implant dose for the second ions. However, it may also be advantageous to choose the first implant dose to be lower than the dose of the second ions in order to further improve the softness of the device and to achieve a smaller voltage maximum during turn-off. These effects are achieved, because due to the smaller first implant dose the doping concentration in the third depth (which is mainly responsible for the softness) can be kept low.

In step (c), the first ions 42 are at least partly diffused into the wafer 10. Depending on the desired doping concentration profile, the first ions 42 are exemplarily diffused to a first depth of at least 13 µm before the second ions 44 are applied. In accordance with an exemplary embodiment, the first ions 42 are diffused to a first depth between 13 and 16 µm, exemplarily between 13 and 15 µm. In another alternative, the first ions 42 are completely diffused before the second ions 44 are applied and diffused. By this at least partial first diffusion, the resulting doping concentration profile is risen in shallower depths and reduced in deeper depths as shown in FIG. 14, which is explained in more detail below.

The diffusion times for the first and second diffusion may also be adapted due to the desired doping concentration profile. In FIG. 14, the effects are shown for variation of the diffusion times. The introduction of a first and second diffusion time corresponds to partly diffusing the first ions 42 before applying the second ions 44. The total diffusion time, for example, the sum of the first and second diffusion times, is chosen to be so long that at least the first ions 42 are diffused into a fifth depth of 18 to 25 µm. For all curves given in FIG. 14, the total diffusion time is the same. The deeper the anode buffer layer is located and the lower the doping profile is at large depths, the better are the switching properties at small currents (see FIG. 17).

Figure 14:
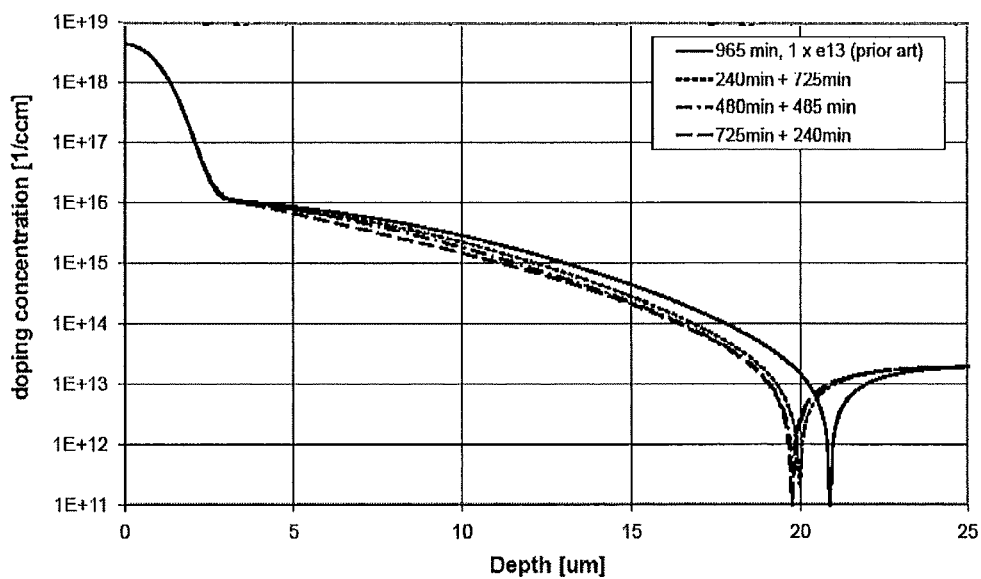
FIG. 14 shows doping concentration profiles of diodes according to the present disclosure and known diodes, wherein the diffusions have been performed with different diffusion times.

The upper continuous line in FIG. 14 shows the doping profile of a known device with one implantation and one diffusion for the anode buffer layer 4 and a diffusion time of 965 min and $1*10^{13}$ cm$^{-2}$. The other profiles have been achieved with the same first and second implant dose of $5*10^{12}$ cm$^{-2}$, i.e. with the same total ion dose as for the known device. The shorter the first diffusion time (first time given in the legend of FIG. 14) is compared to the second diffusion time (second time given in the legend of FIG. 14), the higher the doping concentration in all depths, the leakage current is lowered (upper profiles in FIG. 14). The longer the first diffusion time is, i.e. the deeper the ions have been driven-in in the first diffusion, the lower is the doping profile in all depths, i.e. the softness is further improved (lower profile in FIG. 14). The total diffusion depth is slightly lower than for longer first diffusion time.

In accordance with an exemplary embodiment, the first and second ions 42, 44 are diffused in step (e) such that a total doping concentration between $6.0*10^{15}$ and $2.0*10^{16}$ cm$^{-3}$ is achieved in the second depth.

The fifth depth is the total depth, to which the first ions are diffused to. As the diffusion for the second ions starts later than for the first ions, the second ions are diffused to a shorter depth than the first ions. The fifth depth may vary exemplarily between 18 to 25 µm.

The third ions 52 may be applied in step (f) with a implant dose between $5*10^{13}$ cm$^{-2}$ and $1*10^{15}$ cm$^{-2}$. Exemplarily, in step (g) the third ions 52 are diffused such that a maximum doping concentration of the anode contact layer 5 (surface doping concentration) is achieved between $1.0*10^{17}$ cm$^{-3}$ and $5.0*10^{18}$ cm$^{-3}$ which ensures a good surge current ability of the device. The third ions 52 may be diffused into the wafer 10 up to the fourth depth between 0.5 and 3 µm. Due to the small depth, into which the third ions 52 are diffused to, the diffusion depth of the first and second ions is mainly given by the first and second diffusion (step (c) and (e)). The third diffusion (step (g)) hardly influences the diffusion depth of the first and second ions 42, 44 due to its short diffusion time.

As an alternative to a diode having an anode buffer layer 4 made of two diffusion steps (c) and (e)), the anode buffer layer 4 may be made of a plurality of such ion application and afterwards diffusion of these ions. Each ion application and diffusion step is performed such that the corresponding ions are partly diffused before the next ions are applied (e.g., steps (b) and (c) are repeatedly applied) such that in the end a total doping concentration is achieved between $8.0*10^{15}$ and $2.0*10^{16}$ cm$^{-3}$ in a second depth of 5 µm, exemplarily between $1.0*10^{16}$ and $2.0*10^{16}$ cm$^{-3}$ and between $1.0*10^{14}$ up to $5.0*10^{14}$ cm-3 in a third depth of 15 µm. Of course, the implant doses and the diffusion times given at the examples above are lowered proportionally if more implantations and diffusions are performed.

In accordance with an exemplary embodiment, cathode sided processes on the wafer are performed after finishing the diffusions for the anode layer 3. Such a cathode sided process can be the creation of an n-doped cathode layer 25.

Metal layers for the cathode and anode electrode 6, 7 may be deposited on the cathode and anode side 21, 22 after finalizing all layers in the wafer 10. A metal layer as a cathode electrode 6 is arranged on top of the cathode layer 25 or on top of the drift layer 2, respectively, for a device without a cathode layer 25. A metal layer as an anode electrode 7 is arranged on the anode side 14 of the wafer.

In addition to the creation of the anode layer 3 according to the present disclosure, a defect layer 8 may be created in a sixth depth within the anode buffer layer by irradiation. The defect layer 8 may be created at any manufacturing stage, even after the creation of the metal layers as electrodes 6, 7. Light ions such as protons or helium or protons, electrons or heavy metal diffusion are exemplarily used for the creation of the defect layer 6. The irradiation energy of these ions is chosen such that a defect layer 6 is created with a defect peak, which is arranged in a depth beyond the anode contact layer and outside the space charge region so that the leakage current is not increased, which is exemplarily 8 µm, in particular 7 µm. Therefore, the defect layer is created in a sixth depth of at most 8 µm, exemplarily between 5 and 7 µm.

By placing the defect layer between the crossing point of the anode buffer and anode contact layer, the doping concentration is comparatively low and therefore, the electron-hole plasma in the on-state can be significantly reduced. This improves the SOA of the diode and soft recovery can be achieved. Due to the slower drop of the doping concentration in the anode buffer layer than in the anode contact layer, the process is less delicate to effects, which influence the depth of the defect layer (like changes of the irradiation energy or to any coarseness of the surface of the wafer). At the same time, the defect layer is placed into a region which is not reached by the space charge region (SCR) of the anode junction at breakdown voltage. Thereby, the leakage current can be kept low. By keeping the peak of the defect centers at a smaller depth than the depth of the SCR the radiation defects do not increase the leakage current, because they are not present at the SCR. Local lifetime control can be achieved due to the presence of the defect centers without enhancing the leakage current. Thereby, the diode can be operated at higher temperatures.

Figure 19:
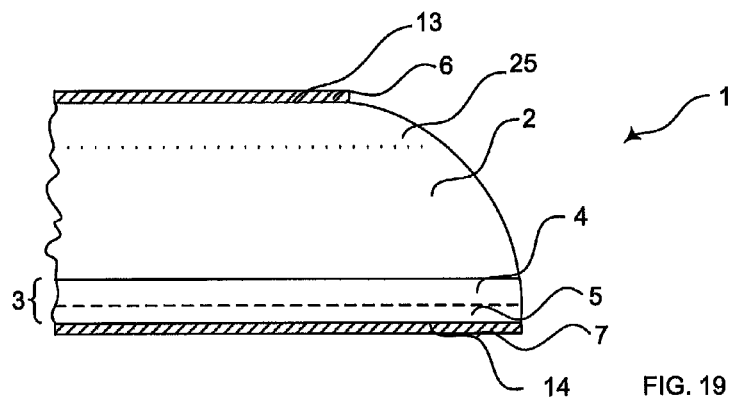
FIG. 19 shows edge termination of a diode according to an exemplary embodiment of the present disclosure.
Figure 20:
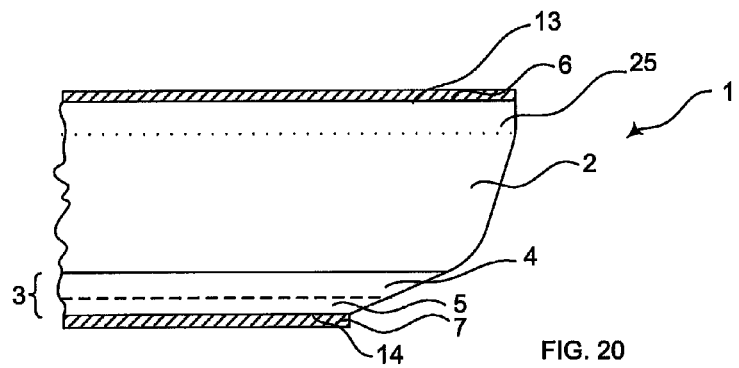
FIG. 20 shows edge termination of a diode according to an exemplary embodiment of the present disclosure.

As shown in FIG. 19, the diode of the present disclosure may optionally have edge terminations from known like positive bevels, which means that the diode 1 has a smaller width at the cathode side 13 than at the anode side 14, or negative bevels as shown in FIG. 20, which means that the diode 1 has a larger width at the cathode side 13 than at the anode side 14. The width of the device is the distance between the lateral sides of the device, whereas the lateral sides are the sides between the cathode side and the anode side 13, 14. The diode 1 can also be terminated by guard rings or VLD (Variation of Lateral Doping).

For devices with a positive or negative bevel, there is an angle of the lateral side of a wafer, which side is arranged between the cathode and the anode side, which angle is different from 90°. In case of a positive bevel, the angle measured from the cathode side inside the silicon is larger than 90°, for a negative bevel, the angle measured inside the silicon is larger than 90° when measured at the anode side. With a negative bevel, the electric field can be reduced on the bevel over a great length due a small doping concentration gradient, which gives advantages in the increased static blocking for the device. This effect is further enhanced by the doping profile according to the present disclosure. The advantages of the bevel termination is the easy manufacturing of discrete diodes and lower leakage current compared to the guard rings and VLD.

It will be appreciated by those skilled in the art that the present invention can be embodied in other specific forms without departing from the spirit or essential characteristics thereof. The presently disclosed embodiments are therefore considered in all respects to be illustrative and not restricted.

The scope of the invention is indicated by the appended claims rather than the foregoing description and all changes that come within the meaning and range and equivalence thereof are intended to be embraced therein.

| Reference List | |
|---|---|
| 1 | diode |
| 10 | wafer |
| 11 | first side |
| 12 | second side |
| 13 | cathode side |
| 14 | anode side |
| 2 | drift layer |
| 25 | cathode layer |
| 3 | anode layer |
| 4 | anode buffer layer |
| 42 | first ions |
| 44 | Second ions |
| 5 | anode contact layer |
| 52 | third ions |
| 6 | cathode electrode |
| 7 | anode electrode |
| 8 | defect layer |

What is claimed is:

1. A method of manufacturing a bipolar diode having a drift layer of a first conductivity type on a cathode side and an anode layer of a second conductivity type on an anode side opposite to the cathode side, the anode layer including an anode contact layer and an anode buffer layer, wherein the second conductivity type is different from the first conductivity type, the method comprising the following manufacturing steps in the following order:
   (a) providing a low-doped wafer of the first conductivity type, the wafer having a first side and a second side opposite to the first side, wherein part of the wafer of unamended doping concentration in the finalized diode forms the drift layer;
   (b) applying first ions to the wafer on the second side;
   (c) diffusing the first ions into the wafer up to a first depth;
   (d) applying second ions to the wafer on the second side;
   (e) creating the anode buffer layer by diffusing the first and second ions into the wafer such that a total doping concentration is achieved between $8.0*10^{15}$ and $2.0*10^{16}$ cm$^{-3}$ cm in a second depth of 5 µm and between $1.0*10^{14}$ up to $5.0*10^{14}$ cm$^{-3}$ in a third depth of 15 µm;
   (f) applying third ions to the wafer on the second side; and
   (g) creating the anode contact layer by diffusing the third ions into the wafer up to a fourth depth of at most 5 µm, wherein all depths are measured from the second side.

2. The method according to claim 1, comprising:
   diffusing the first ions in step (c) up to a first depth of at least 13 µm.

3. The method according to claim 1, comprising:
   diffusing the third ions in step (g) such that a maximum doping concentration of the anode contact layer between $1.0*10^{17}$ cm$^{-3}$ and $5.0*10^{18}$ cm$^{-3}$ achieved.

4. The method according to claim 1, comprising:
   diffusing the third ions in step (g) into the wafer up to a fourth depth between 0.5 and 3 µm.

5. The method according to claim 1, comprising:
   diffusing the first and second ions in step (e) such that a total doping concentration between $1.0*10^{16}$ and $2.0*10^{16}$ cm$^{-3}$ is achieved in the second depth.

6. The method according to claim 1, comprising:
   diffusing the first ions in step (c) into the wafer up to a fifth depth between 18 and 25 µm.

7. The method according to claim 1, comprising:
creating a defect layer by irradiation in a sixth depth of at most 8 μm.

8. The method according to claim 1, comprising:
creating a defect layer by irradiation in a sixth depth between 5 and 7 μm.

9. The method according to claim 1, comprising:
applying the first and second ions in steps (b) and (d) with a first and second implant dose, wherein the sum of the first and second implant dose is between $3*10^{12}$ cm$^{-2}$ and $15*10^{12}$ cm$^{-2}$.

10. The method according to claim 1, comprising:
applying the first and second ions in steps (b) and (d) with a first and second implant dose, wherein the implant dose of the first ions is lower than the implant dose of the second ions.

11. The method according to claim 1, comprising:
diffusing the first ions in step (c) for a first diffusion time; and
diffusing the first and second ions in step (e) for a second diffusion time,
wherein the first diffusion time is longer than the second diffusion time.

12. The method according to claim 1, comprising:
applying the same ions as the first and second ions.

13. The method according to claim 1, wherein the first depth in step (c) is at most 16 μm.

14. A bipolar diode having a drift layer of a first conductivity type on a cathode side and an anode layer of a second conductivity type on an anode side, the second conductivity type being different from the first conductivity type, and the cathode side being opposite to the anode side,
wherein the anode layer comprises a diffused anode contact layer and a diffused anode buffer layer,
wherein the anode contact layer is arranged up to a depth of at most 5 μm,
wherein the anode buffer layer has a doping concentration between $8.0*10^{15}$ and $2.0*10^{16}$ cm$^{-3}$ in a depth of 5 μm and between $1.0*10^{14}$ up to $5.0*10^{14}$ cm$^{-3}$ in a depth of 15 μm, and
wherein all depths are measured from the anode side.

15. The diode according to claim 14, wherein the anode buffer layer is arranged in a depth up to between 18 and 25 μm.

16. The method according to claim 12, wherein the first and second ions include one of B, Al or Ga ions.

17. The method according to claim 3, comprising:
diffusing the third ions in step (f) into the wafer up to a fourth depth between 0.5 and 3 μm.

18. The method according to claim 3, comprising:
diffusing the first and second ions in step (e) such that a total doping concentration between $1.0*10^{16}$ and $2.0*10^{16}$ cm$^{-3}$ is achieved in the second depth.

19. The method according to claim 5, comprising:
applying the first and second ions in steps (b) and (d) with a first and second implant dose, wherein the sum of the first and second implant dose is between $3*10^{12}$ cm$^{-2}$ and $15*10^{12}$ cm$^{-2}$.

20. The method according to claim 9, comprising:
applying the first and second ions in steps (b) and (d) with a first and second implant dose, wherein the implant dose of the first ions is lower than the implant dose of the second ions.

21. The method according to claim 13, wherein the first depth in step (c) is at most 15 μm.

22. The method according to claim 10, comprising:
diffusing the first ions in step (c) for a first diffusion time; and
diffusing the first and second ions in step (e) for a second diffusion time,
wherein the first diffusion time is longer than the second diffusion time.

* * * * *